(12) United States Patent
Schuh et al.

(10) Patent No.: US 10,280,344 B2
(45) Date of Patent: May 7, 2019

(54) ADHESIVE COMPOUNDS COMPRISING MULTI-FUNCTIONAL SILOXANE WATER SCAVENGERS

(71) Applicant: TESA SE, Norderstedt (DE)

(72) Inventors: Christian Schuh, Hamburg (DE); Klaus Keite-Telgenbüscher, Hamburg (DE)

(73) Assignee: TESA SE, Norderstedt (DE)

( * ) Notice: Subject to any disclaimer, the term of this patent is extended or adjusted under 35 U.S.C. 154(b) by 0 days.

(21) Appl. No.: 15/518,166

(22) PCT Filed: Oct. 15, 2015

(86) PCT No.: PCT/EP2015/073904
§ 371 (c)(1),
(2) Date: Apr. 10, 2017

(87) PCT Pub. No.: WO2016/066437
PCT Pub. Date: May 6, 2016

(65) Prior Publication Data
US 2017/0298259 A1 Oct. 19, 2017

(30) Foreign Application Priority Data
Oct. 29, 2014 (DE) .................. 10 2014 222 025

(51) Int. Cl.
*H01L 51/40* (2006.01)
*C09J 153/02* (2006.01)
(Continued)

(52) U.S. Cl.
CPC .......... *C09J 153/02* (2013.01); *C08K 5/1515* (2013.01); *C08K 5/5425* (2013.01); *C08L 83/06* (2013.01);
(Continued)

(58) Field of Classification Search
CPC ............... H01L 51/004; H01L 51/0043; H01L 51/5246; H01L 51/5259; C09J 153/02;
(Continued)

(56) References Cited

U.S. PATENT DOCUMENTS 4,051,195 A 9/1977 McWhorter
4,552,604 A 11/1985 Green
(Continued)

FOREIGN PATENT DOCUMENTS

DE 102008047964 A1 3/2010
DE 102010043866 A1 5/2012
(Continued)

OTHER PUBLICATIONS

International Search Report for corresponding application PCT/EP2015/073904 dated Dec. 23, 2015.
(Continued)

*Primary Examiner* — Brook Kebede
(74) *Attorney, Agent, or Firm* — Norris McLaughlin, PA

(57) ABSTRACT

An adhesive having water vapor barrier properties, comprising an adhesive base composed of at least one reactive resin, at least one elastomer and optionally at least one tackifying resin, and optionally a solvent, is particularly suitable as a barrier adhesive when it comprises at least one multifunctional oligomeric alkoxysiloxane, said oligomeric alkoxysiloxane containing more than one polymerizable group and more than one alkoxy group.

18 Claims, 5 Drawing Sheets

(51) Int. Cl.

| | | |
|---|---|---|
| *C09J 11/06* | (2006.01) | |
| *H01L 51/52* | (2006.01) | |
| *C09J 133/08* | (2006.01) | |
| *H01L 51/00* | (2006.01) | |
| *C08K 5/1515* | (2006.01) | |
| *C08K 5/5425* | (2006.01) | |
| *C08L 83/06* | (2006.01) | |
| *C08L 91/00* | (2006.01) | |
| C08K 5/5435 | (2006.01) | |
| H01L 51/56 | (2006.01) | |
| C08G 77/18 | (2006.01) | |

(52) U.S. Cl.
CPC ............... *C08L 91/00* (2013.01); *C09J 11/06* (2013.01); *C09J 133/08* (2013.01); *H01L 51/004* (2013.01); *H01L 51/0043* (2013.01); *H01L 51/5246* (2013.01); *H01L 51/5259* (2013.01); *C08G 77/18* (2013.01); *C08K 5/5435* (2013.01); *C08K 2201/008* (2013.01); *C08L 2203/206* (2013.01); *C09J 2203/318* (2013.01); *C09J 2203/322* (2013.01); *C09J 2205/102* (2013.01); *C09J 2453/00* (2013.01); *C09J 2463/00* (2013.01); *H01L 51/5253* (2013.01); *H01L 51/56* (2013.01)

(58) Field of Classification Search
CPC ....... C09J 11/06; C09J 133/08; C08K 5/1515; C08K 5/5425; C08L 83/06; C08L 91/00
USPC .................................................... 438/99, 126
See application file for complete search history.

(56) References Cited

U.S. PATENT DOCUMENTS

| | | | |
|---|---|---|---|
| 5,385,986 A | * | 1/1995 | Frihart .................. C08L 77/00 |
| | | | 525/420.5 |
| 6,833,668 B1 | | 12/2004 | Yamada et al. |
| 2004/0225025 A1 | | 11/2004 | Sullivan et al. |
| 2005/0196540 A1 | * | 9/2005 | Pepe ..................... C04B 41/009 |
| | | | 427/384 |
| 2006/0100299 A1 | | 5/2006 | Malik et al. |
| 2010/0068514 A1 | | 3/2010 | Ellinger et al. |
| 2014/0315016 A1 | | 10/2014 | Dollase et al. |

FOREIGN PATENT DOCUMENTS

| | | |
|---|---|---|
| DE | 102012202377 A1 | 4/2013 |
| EP | 1037192 A2 | 9/2000 |
| EP | 1394199 A1 | 3/2004 |
| JP | 2000311782 A | 11/2000 |
| JP | 2004091789 A | 3/2004 |
| JP | 2004296381 A | 10/2004 |
| KR | 1020140090636 A | 7/2014 |
| WO | 9821287 A1 | 5/1998 |
| WO | 03065470 A1 | 8/2003 |
| WO | 2007087281 A1 | 8/2007 |
| WO | 2013165010 A1 | 11/2013 |

OTHER PUBLICATIONS

Notice to File a Response for corresponding application KR 10-2017-7013529 dated Apr. 15, 2018.

* cited by examiner

ADHESIVE COMPOUNDS COMPRISING MULTI-FUNCTIONAL SILOXANE WATER SCAVENGERS

This application is a § 371 U.S. National stage of PCT International Patent Application No. PCT/EP2015/073904, filed Oct. 15, 2015, which claims foreign priority benefit of German Patent Application No. DE 10 2014 222 025.4, filed Oct. 29, 2014, the disclosures of each of which patent applications are incorporated herein by reference.

The present invention relates to an adhesive having water vapour barrier properties for the encapsulation of an (opto) electronic arrangement, comprising at least one reactive resin, at least one polymer, especially elastomer, optionally a tackifying resin and optionally a solvent. The invention further relates to an adhesive tape comprising this adhesive and to the use of such an adhesive.

(Opto)electronic arrangements are being used ever more frequently in commercial products. Arrangements of this kind comprise inorganic or organic electronic structures, for example organic, organometallic or polymeric semiconductors or else combinations thereof. These arrangements and products are rigid or flexible according to the desired use, there being an increasing demand for flexible arrangements. Arrangements of this kind are produced, for example, by printing methods such as relief printing, gravure printing, screen printing, flat printing, or else "non-impact printing", for instance thermal transfer printing, inkjet printing or digital printing. Also used in many cases, however, vacuum methods, for example chemical vapour deposition (CVD), physical vapour deposition (PVD), plasma-enhanced chemical or physical deposition (PECVD) methods, sputtering, (plasma) etching or vaporization, are used, in which case the structuring is generally effected by means of masks.

Examples of (opto)electronic applications that have already been commercialized or are of interest in terms of their market potential include electrophoretic or electrochromic assemblies or displays, organic or polymeric light-emitting diodes (OLEDs or PLEDs) in readout and display devices or as lighting, electroluminescent lamps, light-emitting electrochemical cells (LEECs), organic solar cells, preferably dye or polymer solar cells, inorganic solar cells, preferably thin-film solar cells, especially based on silicon, germanium, copper, indium and selenium, perovskite solar cells, organic field-effect transistors, organic switching elements, organic optical amplifiers, organic laser diodes, organic or inorganic sensors or else organic- or inorganic-based RFID transponders.

Further applications of encapsulating adhesive tapes are known in the field of battery technology, especially in the field of flexible microbatteries and thin-film batteries, very particularly those comprising lithium-containing cathodes, anodes or electrolytes.

Accordingly, in this document, an organic (opto)electronic arrangement is understood to mean an electronic arrangement which comprises at least one electronically functional, at least partly organic constituent—for example organometallic compounds—or wherein the electronically functional structure has a thickness of less than 20 μm.

A technical challenge for the achievement of adequate lifetime and functioning of (opto)electronic arrangements in the field of inorganic and/or organic (opto)electronics, but very particularly in the field of organic (opto)electronics, is considered to be protection of the components present therein from permeates. Permeate may be a multitude of low molecular weight organic or inorganic compounds, especially water vapour and oxygen.

A multitude of (opto)electronic arrangements in the field of inorganic and/or organic (opto)electronics, very particularly in the case of use of organic raw materials, are sensitive both to water vapour and to oxygen, the penetration of water or water vapour being classified as a major problem for many arrangements. During the lifetime of the electronic arrangement, therefore, protection by encapsulation is required, since the performance otherwise declines over the period of use. For example, oxidation of the constituents can result, for instance, in a severe reduction in luminance in the case of light-emitting arrangements such as electroluminescent lamps (EL lamps) or organic light-emitting diodes (OLEDs), in contrast in the case of electrophoretic displays (EP displays), or in efficiency within a very short time in the case of solar cells.

In inorganic and organic (opto)electronics, especially in organic (opto)electronics, there is a particular demand for flexible bonding solutions which constitute a permeation barrier for permeates such as oxygen and/or water vapour. In addition, there is a multitude of further demands for such (opto)electronic arrangements. The flexible bonding solutions should therefore not just achieve good adhesion between two substrates but additionally fulfil properties such as high shear strength and peel strength, chemical stability, ageing resistance, high transparency, ease of processibility and high flexibility and pliability.

A standard approach according to the prior art is therefore to place the electronic arrangement between two substrates impervious to water vapour and oxygen. This is then followed by sealing at the edges. For inflexible assemblies, glass or metal substrates are used, which give a high permeation barrier but are very prone to mechanical stresses. Moreover, these substrates cause a relatively high thickness of the overall arrangement. In the case of metal substrates, there is additionally no transparency. For flexible arrangements, in contrast, flat substrates such as transparent or nontransparent films are used, which may have a multi-ply configuration. In this case, it is possible to use either combinations of different polymers or inorganic or organic layers. The use of such flat substrates enables a flexible, exceptionally thin construction. For the various applications, a wide variety of different substrates are possible, for example films, woven and nonwoven fabrics and papers or combinations thereof.

In order to achieve very good sealing, specific barrier adhesives are used (also referred to as adhesives having water vapour barrier properties). A good adhesive for the sealing of (opto)electronic components has low permeability to oxygen and especially to water vapour, has sufficient adhesion on the arrangement and can adapt well thereto. Low adhesion on the arrangement reduces the barrier effect at the interface, which enables entry of oxygen and water vapour irrespective of the properties of the adhesive. Only when there is contact between the adhesive and substrate throughout are the bulk properties the determining factor for the barrier action of the adhesive.

The barrier action is typically characterized by reporting the oxygen transmission rate (OTR) and the water vapour transmission rate (WVTR). The respective rate indicates the area- and time-based flow of oxygen or water vapour through a film under specific conditions of temperature and partial pressure and possibly further measurement conditions such as relative air humidity. The smaller these values, the better the suitability of the respective material for encapsulation. The reported permeation is not based solely on the values of WVTR or OTR but always also includes specification of the mean path length of the permeation, for example the thickness of the material, or normalization to a particular path length.

The permeability P is a measure of the ability of gases and/or liquids to permeate through a body. A low P value indicates a good barrier action. The permeability P is a specific value for a defined material and a defined permeate under steady-state conditions with a particular permeation path length, partial pressure and temperature. The permeability P is the product of the diffusion term D and solubility term S: $P=D*S$.

The solubility term S predominantly describes the affinity of the barrier adhesive for the permeate. In the case of water vapour, for example, a small value of S is achieved by hydrophobic materials. The diffusion term D is a measure of the mobility of the permeate in the barrier material and is directly dependent on properties such as molecular mobility or the free volume. It is often the case that relatively low values are achieved for D in highly crosslinked or highly crystalline materials. However, highly crystalline materials are generally less transparent, and greater crosslinking leads to lower flexibility. The permeability P typically rises with an increase in molecular mobility, for instance when the temperature is increased or the glass transition point is exceeded.

Attempts to increase the barrier action of an adhesive have to take account of both parameters D and S, especially with regard to the effect on the permeability of water vapour and oxygen. In addition to these chemical properties, effects of physical influences on permeability also have to be considered, especially the mean permeation path length and interfacial properties (adaptation characteristics of the adhesive, adhesion). The ideal barrier adhesive has low D values and S values combined with very good adhesion on the substrate.

A low solubility term S alone is usually insufficient to achieve good barrier properties. A particular classic example of this is that of siloxane elastomers. The materials are extremely hydrophobic (small solubility term), but by virtue of the free rotation about the Si—O bond (large diffusion term) have a comparatively small barrier action against water vapour and oxygen. For good barrier action, a good balance is thus needed between the solubility term S and diffusion term D.

For this purpose, in particular, liquid adhesives and adhesives based on epoxides have been used to date (WO 98/21287 A1; U.S. Pat. Nos. 4,051,195 A; 4,552,604 A). These have a small diffusion term D as a result of significant crosslinking. The main field of use thereof is in edge bonds of rigid arrangements, but also moderately flexible arrangements. Curing is effected thermally or by means of UV radiation. A full-area bond is barely possible because of the shrinkage that occurs as a result of the curing, since there are stresses between the adhesive and substrate in the course of curing, which can in turn lead to delamination.

The use of these liquid adhesives harbours a number of disadvantages. For instance, low molecular weight constituents (VOCs, volatile organic compounds) can damage the sensitive electronic structures in the arrangement and make them difficult to handle in production. The adhesive has to be applied to every single constituent of the arrangement in a costly and inconvenient manner. The purchase of costly dispensers and fixing devices is necessary to assure exact positioning. The method of application additionally prevents a rapid continuous process, and the lamination step subsequently required, because of the low viscosity, can also make it difficult to achieve a defined layer thickness and bond width within narrow limits.

Furthermore, such highly crosslinked adhesives have only a low flexibility after curing. The use of thermally crosslinking systems in the low temperature range or in the case of 2-pack systems is limited by the pot life, i.e. the processing time before occurrence of gelation. In the high temperature range and especially with long reaction times, it is again the sensitive (opto)electronic structures that limit the usability of such systems—the maximum temperatures employable in the case of (opto)electronic structures are sometimes only 60° C., since preliminary damage can already occur over and above this temperature. Flexible arrangements in particular, which contain organic electronics and are encapsulated with transparent polymer films or composites composed of polymer films and inorganic layers, set tight limits here. This also applies to lamination steps under high pressure. In order to achieve improved service life, it is advantageous here to dispense with any step that causes thermal stress and any lamination under relatively low pressure.

Another alternative to thermally curable liquid adhesives which has now become established is that of using radiation-curing adhesives (US 2004/0225025 A1). The use of radiation-curing adhesives avoids long-lasting thermal stress on the electronic arrangement. However, the stress results in brief point heating of the arrangement, since a very high proportion of IR radiation is generally emitted as well as UV radiation. Further abovementioned disadvantages of liquid adhesives such as VOC, shrinkage, delamination and low flexibility are likewise maintained. Problems can arise from additional volatile constituents or cleavage products formed from the photoinitiators or sensitizers. Moreover, the arrangement has to be transparent to UV light.

Since constituents especially in organic electronics and many of the polymers used are frequently sensitive to UV stress, prolonged outdoor use is not possible without further additional protective measures, for instance further cover films. In the case of UV-curing adhesive systems, these can only be applied after the UV curing, which additionally increases the complexity of manufacture and the thickness of the arrangement.

US 2006/0100299 A1 discloses a UV-curing pressure-sensitive adhesive tape for encapsulation of an electronic arrangement. The pressure-sensitive adhesive tape comprises an adhesive based on a combination of a polymer having a softening point of greater than 60° C., a polymerizable epoxy resin having a softening point below 30° C. and a photoinitiator. The polymers may be polyurethane, polyisobutylene, polyacrylonitrile, polyvinylidene chloride, poly(meth)acrylate or polyesters, but especially an acrylate. Additionally present are tackifying resins, plasticizers or fillers.

Acrylate adhesives have very good stability to UV radiation and various chemicals, but have very different bonding forces on different substrates. While the bonding force on polar substrates such as glass or metal is very high, the bonding force on non-polar substrates such as polyethylene or polypropylene, for example, is comparatively low. There is a particular risk here of diffusion at the interface. Moreover, these adhesives are very polar, which promotes diffusion, especially of water vapour, in spite of subsequent crosslinking. The use of polymerizable epoxy resins further enhances this tendency.

In contrast to liquid adhesives, pressure-sensitive adhesive tapes, as a result of the relatively high molecular weight of the polymers, generally require a certain time, sufficient pressure and a good balance between viscous component and elastic component to achieve good wetting and bonding on the surface.

WO 2007/087281 A1 discloses a transparent flexible pressure-sensitive adhesive tape based on polyisobutylene (PIB) for electronic applications, especially OLEDs. This involves using polyisobutylene having a molecular weight of more than 500 000 g/mol and a hydrogenated cyclic resin. It is optionally possible to use a photopolymerizable resin and a photoinitiator.

Because of their low polarity, adhesives based on polyisobutylene have a good barrier against water vapour, but even at high molecular weights have relatively low cohesiveness, which is the reason why they frequently have low shear strength at elevated temperatures. The proportion of low molecular weight constituents cannot be reduced arbitrarily, since bonding is otherwise distinctly reduced and interfacial permeation increases. In the case of use of a high proportion of functional resins, which is needed because of the very low cohesion of the adhesive, the polarity of the adhesive is increased again and hence the solubility term becomes greater.

There have additionally been descriptions of barrier adhesives based on styrene block copolymers and resins having maximum hydrogenation levels (see DE 10 2008 047 964 A1).

Permeation values (WVTR) of commonly used adhesive systems are also reported here (measured at 37.5° C. and 90% relative humidity). Typical acrylate-based pressure-sensitive adhesives are in the range between 100 $g/m^2$ d and 1000 $g/m^2$ d. Because of the high mobility of the chains, pressure-sensitive silicone adhesives have even higher permeation values for water of more than 1000 $g/m^2$ d. If styrene block copolymers are used as elastomer component, WVTR values in the range from 50 to 100 $g/m^2$ d are achieved for unhydrogenated or incompletely hydrogenated systems and values below 50 $g/m^2$ d for hydrogenated systems (for example SEBS). Particularly low WVTR values of less than 15 $g/m^2$ d are achieved both with pure poly(isobutylene) elastomers or block copolymers of styrene and isobutylene.

The formation of at least two domains within the block copolymer additionally gives very good cohesion at room temperature and simultaneously improved barrier properties.

One means of improving the barrier action again is to use substances that react with water or oxygen. Oxygen or water vapour that penetrates into the (opto)electronic arrangement is then bound chemically or physically, preferably chemically, to these substances. The substances are referred to in the literature as "getters", "scavengers", "desiccants" or "absorbers". Only the term "getters" is used hereinafter. The getters of this kind that have been described in adhesives are mainly inorganic fillers, for example calcium chloride or various oxides. Since they are insoluble in the adhesive, they have the disadvantage that the adhesive loses transparency and, given appropriate filler levels, adhesion. Therefore, organic getters or hybrids that are soluble in the adhesive are more suitable, but they must not migrate out of the adhesive into the organic electronics. These additions do not so much alter the diffusion values as the breakthrough time in essence, meaning the time that the moisture takes to cover the distance through the adhesive and reach the sensitive electronic assembly. If the substances have been saturated with water or oxygen or used up in a chemical reaction with water or oxygen, they no longer have any effect either, in which case the diffusion is merely that of the adhesive without the getter. In spite of this, these getters can increase the lifetime of the (opto)electronic components.

In summary, getter materials are, for example, salts such as cobalt chloride, calcium chloride, calcium bromide, lithium chloride, lithium bromide, magnesium chloride, barium perchlorate, magnesium perchlorate, zinc chloride, zinc bromide, silicas (for example silica gel), aluminium sulphate, calcium sulphate, copper sulphate, barium sulphate, magnesium sulphate, lithium sulphate, sodium sulphate, cobalt sulphate, titanium sulphate, sodium dithionite, sodium carbonate, potassium disulphite, potassium carbonate, magnesium carbonate, titanium dioxide, kieselguhr, zeolites, sheet silicates such as montmorillonite and bentonite, metal oxides such as barium oxide, calcium oxide, iron oxide, magnesium oxide, sodium oxide, potassium oxide, strontium oxide, aluminium oxide (activated alumina), and also carbon nanotubes, activated carbon, phosphorus pentoxide and silanes; readily oxidizable metals, for example iron, calcium, sodium and magnesium; metal hydrides, for example calcium hydride, barium hydride, strontium hydride, sodium hydride and lithium aluminium hydride; hydroxides such as potassium hydroxide and sodium hydroxide, metal complexes, for example aluminium acetylacetonate; and additionally organic absorbers, for example polyolefin copolymers, polyamide copolymers, PET copolyesters, anhydrides of mono- and polycarboxylic acids such as acetic anhydride, propionic anhydride, butyric anhydride or methyltetrahydrophthalic anhydride, isocyanates or further absorbers based on hybrid polymers, which are usually used in combination with catalysts, for example cobalt, further organic absorbers, for instance lightly crosslinked polyacrylic acid, polyvinyl alcohol, ascorbates, glucose, gallic acid or unsaturated fats and oils.

In accordance with their function, the getter materials are preferably used as essentially permeate-free materials, for example in water-free form. This distinguishes getter materials from similar materials which are used as filler. For example, silica is frequently used as filler in the form of fumed silica. If this filler, however, is stored as usual under ambient conditions, it absorbs water even from the environment and is no longer able to function as a getter material to an industrially utilizable degree. It is only silica that has been dried or kept dry that can be utilized as getter material. However, it is also possible to use materials already partly complexed with permeates, for example $CaSO_4 * \frac{1}{2} H_2O$ (calcium sulphate hemihydrate) or partly hydrated silicas which exist by definition as compounds of the general formula $(SiO_2)m*nH_2O$.

As described above, silicas are understood to mean compounds of the general formula $(SiO_2)m*nH_2O$. This is silicon dioxide produced by wet-chemical, thermal or pyrogenic methods. More particularly, suitable getter materials among the silicas are silica gels, for example silica gels impregnated with cobalt compounds as moisture indicator (blue gel), and fumed silicas.

Examples of the use of getters in liquid adhesive systems for encapsulation of (opto)electronic assemblies are given, for example, in U.S. Pat. No. 6,833,668 B1, JP 2000 311 782 A and EP 1 037 192 A2.

The prior art additionally discloses a pressure-sensitive adhesive (WO 03/065470 A1) which is used as transfer adhesive in an electronic assembly. The adhesive comprises an inorganic functional filler which reacts with oxygen or water vapour within the assembly. In this way, simple application of a getter within the assembly is possible. For the sealing of the assembly on the outside, a further adhesive having low permeability is used. A similar pressure-sensitive adhesive is employed in JP 2004 296 381 A. Here too, exclusively inorganic getters are used.

DE 10 2010 043 866 A1 describes an adhesive for encapsulation, comprising silane-modified polymers. The adhesive has improved breakthrough times to a certain degree compared to the prior art cited in the document. In spite of this, a further improvement in the breakthrough times is desirable. However, the silane-modified polymers described here are monofunctional, meaning that only the silanized acid anhydride groups and possibly unreacted anhydride groups are present. No polymerizable groups are present.

It is known from the prior art that alkoxysilanes can be used as water scavengers. In EP 1 394 199 A1, alkoxysilanes serve as water scavengers, desiccants or anti-precrosslinking agents, or in other words as stabilizers for moisture-crosslinking sealing compounds in particular. Both monomeric and oligomeric alkoxysilanes are used here with equal success.

It was an object of the invention to provide an adhesive having distinctly improved breakthrough times compared to the prior art, but this must not be accompanied by any material deterioration in the properties of the adhesive. The adhesive must still be easy to handle and applicable in a simple manner.

It has been found that, surprisingly, the breakthrough times of an adhesive having water vapour barrier properties as specified at the outset are improved in a relevant manner when the adhesive comprises at least one multifunctional oligomeric alkoxysiloxane, said oligomeric alkoxysiloxane containing more than one polymerizable group and more than one alkoxy group. Said alkoxysiloxane preferably has one alkoxy group and one polymerizable group per silicon atom. Said alkoxy group may be the same as or different from adjacent Si-alkoxy groups. The polymerizable group of adjacent repeat units may likewise be the same or different.

In principle, it is already possible to increase the breakthrough time of (water vapour) barrier adhesives with alkoxysilane compounds compared to barrier adhesives lacking any such added molecules. However, the performance of the multifunctional siloxane getter is surprisingly even higher, even though the relative amount of water-scavenging groups is lower.

The polymerizable groups are incorporated as well into the network of the reactive resin in the curing step, and so there is no lowering of the point network density compared to adhesives lacking added getters. Adhesives comprising monomeric alkoxysiloxanes do not have any significant improvement in the breakthrough time of water compared to adhesives lacking added getters. There is a reduction here in the network density compared to adhesives lacking added getters. The effect of this is that diffusion is facilitated because of the less tight network and hence, in spite of the getter function, there is not such a distinct rise in performance as with the multifunctional oligomeric siloxane that additionally functions as crosslinker according to the present invention. Oligomeric siloxanes that are not multifunctional, meaning that they have alkoxy groups but not a further functional polymerizable group, do not cure in the curing step. Thus, they act as a kind of plasticizer and also enable easier permeation of water molecules, and so the performance of the barrier adhesive is comparable to the adhesive without getter addditization in spite of the alkoxysilane groups.

The adhesive of the invention is partly crosslinkable since, as well as the at least one reactive resin component, it also contains at least one polymer, especially an elastomer and optionally a tackifying resin. The gel content of the adhesive, i.e. that proportion of the adhesive which cannot be dissolved on dissolution of the adhesive in a suitable solvent, is suitably less than 90% by weight, especially less than 80% by weight, preferably less than 70% by weight, more preferably less than 50% by weight and most preferably less than 30% by weight.

Particular preference is given to those adhesives wherein the adhesive base has a water vapour permeation rate after the activation of the reactive resin component of less than 100 g/m²d, preferably of less than 50 g/m²d, especially less than 15 g/m²d.

Preferably, the at least one alkoxysiloxane is a compound of the general formula

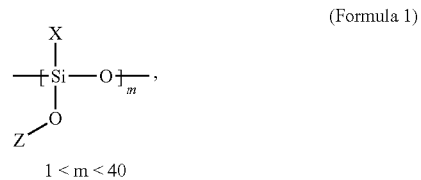

(Formula 1)

$1 < m < 40$ where X is a radical having a polymerizable group selected from cyclic ether, vinyl, acrylate, methacrylate, hydroxyl, amino and isocyanate, where Z is an alkyl or aryl group, where the X radical may be the same or different, where the Z radical may be the same or different. For example, the alkoxysiloxane may be a copolymer formed from two different alkoxysiloxanes, one of which has an epoxide and the other a vinyl group as polymerizable group.

The Z radical may be any alkyl or aryl group, particular preference being given to a methyl or ethyl group. The Z radical may also be different. For instance, the alkoxysiloxane may also contain, as Z radical, both methyl and ethyl groups.

In a particularly suitable execution, the X radical contains a polymerizable functional group selected from cyclic ethers, especially oxirane and/or oxetane, acrylate, methacrylate, vinyl, particular preference being given to vinyl and cyclic ethers, and in this context especially 3,4-epoxycyclohexyl.

Preferably, the multifunctional getter is an oligomeric alkoxysiloxane of vinyltrimethoxysilane and/or vinyltriethoxysilane.

In another preferred execution, the X group of the multifunctional getter contains a cyclic ether group, particularly preferred getters being oligomeric alkoxysiloxanes of 2-(3, 4-epoxycyclohexyl)ethylmethyldimethoxysilane, 2-(3,4-epoxycyclohexyl)ethylmethyldiethoxysilane, gamma-(glycidoxypropyl)trimethoxysilane, gamma-(glycidoxypropyl)triethoxysilane and especially 2-(3,4-epoxycyclohexyl)ethyltrimethoxysilane and/or 2-(3,4-epoxycyclohexyl)ethyltriethoxysilane.

The proportion of oligomeric alkoxysiloxane in the adhesive composition is preferably 0.5% to 90% by weight, especially 2% to 90% by weight and more preferably 5% to 80% by weight.

Adhesives having a high proportion of oligomeric alkoxysiloxane have a high water absorption capacity, and so a high proportion, preferably 15% to 80% by weight, especially 15% to 70% by weight and more preferably 20% to 65% by weight, is particularly advantageous. This proportion is based here and hereinafter on the adhesive composition without any optionally present solvent, unless stated otherwise.

On the other hand, the oligomeric alkoxysiloxane is frequently of low viscosity. This affects the properties, especially the ease of use of the adhesive. Therefore, in a further preferred execution of the adhesive, 0.5% to 5% by weight, more preferably 0.5% to 2% by weight (based on the adhesive composition), of the oligomeric alkoxysiloxane is present.

Finally, preference is given to those adhesives having a particularly good balance in terms of their properties in relation to ease of use and water absorption capacity and containing 2% to 25% by weight, especially 2% to 15% by weight and more preferably 5% to 15% by weight (based on the adhesive composition) of the oligomeric alkoxysiloxane.

The polymer may be a polymer, or else a mixture of two or more different polymers. In this case, the at least one polymer may especially be an elastomer or a thermoplastic.

Elastomers used may in principle be any elastomers that are customary in the pressure-sensitive adhesives sector, as described, for example, in the "Handbook of Pressure Sensitive Adhesive Technology" by Donatas Satas (Satas & Associates, Warwick 1999).

Preferably in the context of the application, the elastomers used, in a chemical sense, are formed from at least one olefinic monomer or from polyurethane and are, for example, elastomers based on polyurethanes, natural rubbers, synthetic rubbers such as butyl, (iso)butyl, nitrile or butadiene rubbers, styrene block copolymers having an elastomer block formed from unsaturated or partly or fully hydrogenated polydiene blocks (polybutadiene, polyisoprene, poly(iso)butylene, copolymers of these and further elastomer blocks familiar to those skilled in the art), polyolefins, fluoropolymers and/or silicones.

If rubber or synthetic rubber or blends produced therefrom are used as base material for the pressure-sensitive adhesive, the natural rubber may in principle be chosen from all available qualities, for example crepe, RSS, ADS, TSR or CVs, according to the required purity and viscosity level, and the synthetic rubber(s) from the group of the randomly copolymerized styrene-butadiene rubbers (SBR), the butadiene rubbers (BR), the synthetic polyisoprenes (IR), the butyl rubbers (IIR), the halogenated butyl rubbers (XIIR), the acrylate rubbers (ACM), the ethylene-vinyl acetate copolymers (EVA) or the polyurethanes and/or blends thereof.

The at least one polymer used may also be any kind of thermoplastic known to those skilled in the art, as specified, for example, in the textbooks "Chemie und Physik der synthetischen Polymere" [Chemistry and Physics of Synthetic Polymers] by J. M. G. Cowie (Vieweg, Braunschweig) and "Makromolekulare Chemie" [Macromolecular Chemistry] by B. Tieke (VCH Weinheim, 1997). These are, for example, poly(ethylene), poly(propylene), poly(vinyl chloride), poly(styrene), poly(oxymethylenes), poly(ethylene oxide), poly(ethylene terephthalate), poly(carbonates), poly(phenylene oxides), poly(urethanes), poly(ureas), phenoxy resins, acrylonitrile-butadiene-styrene (ABS), poly(amides) (PA), poly(lactate) (PLA), poly(ether ether ketone) (PEEK), poly(sulphone) (PSU), poly(ether sulphone) (PES). Poly(acrylates), poly(methacrylates) and poly(methyl methacrylates) (PMMA) are likewise possible as polymer, but are not preferred in the context of the present invention.

Reactive resins used, also referred to as crosslinkable components, may in principle be any reactive constituents that are known to the person skilled in the art in the field of pressure-sensitive adhesives or reactive adhesives and form macromolecules that crosslink in a molecular weight-increasing reaction, as described, for example, in Gerd Habenicht: Kleben-Grundlagen, Technologien, Anwendungen [Adhesive Bonding Principles, Technologies, Applications], 6th edition, Springer, 2009. These are, for example, constituents that form epoxides, polyesters, polyethers, polyurethanes or phenol resin, cresol or novolak based polymers, polysulphides or acrylic polymers (acrylic, methacrylic).

The structure and chemical nature of the crosslinkable components are uncritical, provided that they are at least partly miscible with the elastomer phase and the molecular weight-increasing reaction can be conducted under conditions, especially in terms of the temperatures employed, type of catalysts used and the like, that do not lead to any significant impairment and/or breakdown of the elastomer phase.

The reactive resin preferably consists of a cyclic ether and is suitable for the radiation-chemical and optionally thermal crosslinking with a softening temperature of less than 40° C., preferably of less than 20° C.

The reactive resins based on cyclic ethers are especially epoxides, i.e. compounds which bear at least one oxirane group, or oxetanes. They may be aromatic or especially aliphatic or cycloaliphatic in nature.

Usable reactive resins may be monofunctional, difunctional, trifunctional or tetrafunctional or have higher functionality up to polyfunctionality, the functionality relating to the cyclic ether group.

Examples, without wishing to impose a restriction, are 3,4-epoxycyclohexylmethyl-3',4'-epoxycyclohexane carboxylate (EEC) and derivatives, dicyclopentadiene dioxide and derivatives, 3-ethyl-3-oxetanemethanol and derivatives, diglycidyl tetrahydrophthalate and derivatives, diglycidyl hexahydrophthalate and derivatives, ethane 1,2-diglycidyl ether and derivatives, propane 1,3-diglycidyl ether and derivatives, butane-1,4-diol diglycidyl ether and derivatives, higher alkane 1,n-diglycidyl ethers and derivatives, bis[(3, 4-epoxycyclohexyl)methyl] adipate and derivatives, vinylcyclohexyl dioxide and derivatives, cyclohexane-1,4-dimethanolbis(3,4-epoxycyclohexane carboxylate) and derivatives, diglycidyl 4,5-epoxytetrahydrophthalate and derivatives, bis[1-ethyl(3-oxetanyl)methyl) ether and derivatives, pentaerythritol tetraglycidyl ether and derivatives, bisphenol A diglycidyl ether (DGEBA), hydrogenated bisphenol A diglycidyl ether, bisphenol F diglycidyl ether, hydrogenated bisphenol F diglycidyl ether, epoxyphenol novolaks, hydrogenated epoxyphenol novolaks, epoxycresol novolaks, hydrogenated epoxycresol novolaks, 2-(7-oxabicyclo; spiro[1,3-dioxane-5,3'-[7]oxabicyclo[4.1.0]heptane], 1,4-bis((2,3-epoxypropoxy)methyl)cyclohexanes.

Particularly suitable for cationic curing are reactive resins based on cyclohexyl epoxide, for example 3,4-epoxycyclohexylmethyl 3',4'-epoxycyclohexanecarboxylate (EEC) and derivatives and bis[(3,4-epoxycyclohexyl)methyl] adipate and derivatives.

Reactive resins may be used in their monomeric or else dimeric forms, trimeric forms, etc. up to and including their oligomeric forms.

Mixtures of reactive resins with one another, or else with other co-reactive compounds such as alcohols (monofunctional or polyfunctional) or vinyl ethers (monofunctional or polyfunctional) are likewise possible.

Among the initiators for cationic UV curing, sulphonium-, iodonium- and metallocene-based systems in particular are usable. For examples of sulphonium-based cations, reference is made to the details given in U.S. Pat. No. 6,908,722 B1 (especially columns 10 to 21).

Examples of anions which serve as counterions for the abovementioned cations include tetrafluoroborate, tetraphenylborate, hexafluorophosphate, perchlorate, tetrachloroferrate, hexafluoroarsenate, hexafluoroantimonate, pentafluorohydroxyantimonate, hexachloroantimonate, tetrakispentafluorophenylborate, tetrakis(pentafluoromethylphenyl)borate, bi(trifluoromethylsulphonyl)amide and tris(trifluoromethylsulphonyl)methide. Other conceivable anions particularly for iodonium-based initiators are additionally chloride, bromide or iodide, but preference is given to initiators that are essentially free of chlorine and bromine.

More specifically, the usable systems include sulphonium salts (see, for example, U.S. Pat. Nos. 4,231,951 A, 4,256,828 A, 4,058,401 A, 4,138,255 A and US 2010/063221 A1), such as triphenylsulphonium hexafluoroarsenate, triphenylsulphonium hexafluoroborate, triphenylsulphonium tetrafluoroborate, triphenylsulphonium tetrakis(pentafluorobenzyl)borate, methyldiphenylsulphonium tetrafluoroborate, methyldiphenylsulphonium tetrakis(pentafluorobenzyl)borate, dimethylphenylsulphonium hexafluorophosphate, triphenylsulphonium hexafluorophosphate, triphenylsulphonium hexafluoroantimonate, diphenylnaphthylsulphonium hexafluoroarsenate, tritolylsulphonium hexafluorophosphate, anisyldiphenylsulphonium hexafluoroantimonate, 4-butoxyphenyldiphenylsulphonium tetrafluoroborate, 4-chlorophenyldiphenylsulphonium hexafluoroantimonate, tris(4-phenoxyphenyl)sulphonium hexafluorophosphate, di(4-ethoxyphenyl)methylsulphonium hexafluoroarsenate, 4-acetylphenyldiphenylsulphonium tetrafluoroborate, 4-acetylphenyldiphenylsulphonium tetrakis(pentafluorobenzyl)borate, tris(4-thiomethoxyphenyl) sulphonium hexafluorophosphate, di(methoxysulphonylphenyl)methylsulphonium hexafluoroantimonate, di(methoxynaphthyl)methylsulphonium tetrafluoroborate, di(methoxynaphthyl)methylsulphonium tetrakis(pentafluorobenzyl)borate, di(carbomethoxyphenyl)methylsulphonium hexafluorophosphate, (4-octyloxyphenyl)diphenylsulphonium tetrakis(3,5-bis(trifluoromethyl)phenyl)borate, tris[4-(4-acetylphenyl)thiophenyl]sulphonium tetrakis(pentafluorophenyl)borate, tris(dodecylphenyl)sulphonium tetrakis(3,5-bis-trifluoromethylphenyl)borate, 4-acetamidophenyldiphenylsulphonium tetrafluoroborate, 4-acetamidophenyldiphenylsulphonium tetrakis(pentafluorobenzyl)borate, dimethylnaphthylsulphonium hexafluorophosphate, trifluoromethyldiphenylsulphonium tetrafluoroborate, trifluoromethyldiphenylsulphonium tetrakis(pentafluorobenzyl)borate, phenylmethylbenzylsulphonium hexafluorophosphate, 5-methylthianthrenium hexafluorophosphate, 10-phenyl-9,9-dimethylthioxanthenium hexafluorophosphate, 10-phenyl-9-oxothioxanthenium tetrafluoroborate, 10-phenyl-9-oxothioxanthenium tetrakis(pentafluorobenzyl)borate, 5-methyl-10-oxothianthrenium tetrafluoroborate, 5-methyl-10-oxothianthrenium tetrakis(pentafluorobenzyl)borate and 5-methyl-10,10-dioxothianthrenium hexafluorophosphate, iodonium salts (see, for example, U.S. Pat. Nos. 3,729,313 A, 3,741,769 A, 4,250,053 A, 4,394,403 A and US 2010/063221 A1), such as diphenyliodonium tetrafluoroborate, di(4-methylphenyl)iodonium tetrafluoroborate, phenyl-4-methylphenyliodonium tetrafluoroborate, di(4-chlorophenyl)iodonium hexafluorophosphate, dinaphthyliodonium tetrafluoroborate, di(4-trifluoromethylphenyl)iodonium tetrafluoroborate, diphenyliodonium hexafluorophosphate, di(4-methylphenyl)iodonium hexafluorophosphate, diphenyliodonium hexafluoroarsenate, di(4-phenoxyphenyl)iodonium tetrafluoroborate, phenyl-2-thienyliodonium hexafluorophosphate, 3,5-dimethylpyrazolyl-4-phenyliodonium hexafluorophosphate, diphenyliodonium hexafluoroantimonate, 2,2'-diphenyliodonium tetrafluoroborate, di(2,4-dichlorophenyl)iodonium hexafluorophosphate, di(4-bromophenyl)iodonium hexafluorophosphate, di(4-methoxyphenyl)iodonium hexafluorophosphate, di(3-carboxyphenyl)iodonium hexafluorophosphate, di(3-methoxycarbonylphenyl)iodonium hexafluorophosphate, di(3-methoxysulphonylphenyl)iodonium hexafluorophosphate, di(4-acetamidophenyl)iodonium hexafluorophosphate, di(2-benzothienyl)iodonium hexafluorophosphate, diaryliodonium tristrifluoromethylsulphonylmethide such as diphenyliodonium hexafluoroantimonate, diaryliodonium tetrakis(pentafluorophenyl)borate such as diphenyliodonium tetrakis(pentafluorophenyl)borate, (4-n-desiloxyphenyl)phenyliodonium hexafluoroantimonate, [4-(2-hydroxy-n-tetradesiloxy)phenyl]phenyliodonium hexafluoroantimonate, [4-(2-hydroxy-n-tetradesiloxy)phenyl]phenyliodonium trifluorosulphonate, [4-(2-hydroxy-n-tetradesiloxy)phenyl]phenyliodonium hexafluorophosphate, [4-(2-hydroxy-n-tetradesiloxy)phenyl]phenyliodonium tetrakis(pentafluorophenyl)borate, bis(4-tert-butylphenyl)iodonium hexafluoroantimonate, bis(4-tert-butylphenyl)iodonium hexafluorophosphate, bis(4-tert-butylphenyl)iodonium trifluorosulphonate, bis(4-tert-butylphenyl)iodonium tetrafluoroborate, bis(dodecylphenyl)iodonium hexafluoroantimonate, bis(dodecylphenyl)iodonium tetrafluoroborate, bis(dodecylphenyl)iodonium hexafluorophosphate, bis(dodecylphenyl)iodonium trifluoromethylsulphonate, di(dodecylphenyl)iodonium hexafluoroantimonate, di(dodecylphenyl)iodonium triflate, diphenyliodonium bisulphate, 4,4'-dichlorodiphenyliodonium bisulphate, 4,4'-dibromodiphenyliodonium bisulphate, 3,3'-dinitrodiphenyliodonium bisulphate, 4,4'-dimethyldiphenyliodonium bisulphate, 4,4'-bis(succinimidodiphenyl)iodonium bisulphate, 3-nitrodiphenyliodonium bisulphate, 4,4'-dimethoxydiphenyliodonium bisulphate, bis(dodecylphenyl)iodonium tetrakis(pentafluorophenyl)borate, (4-octyloxyphenyl)phenyliodonium tetrakis(3,5-bis-trifluoromethylphenyl)borate and (tolylcumyl)iodonium tetrakis(pentafluorophenyl)borate, and ferrocenium salts (see, for example, EP 0 542 716 B1) such as $\eta^5$-(2,4-cyclopentadien-1-yl)-[(1,2,3,4,5,6,9)-(1-methylethyl)benzene]iron.

Examples of commercialized photoinitiators are Cyracure UVI-6990, Cyracure UVI-6992, Cyracure UVI-6974 and Cyracure UVI-6976 from Union Carbide, Optomer SP-55, Optomer SP-150, Optomer SP-151, Optomer SP-170 and Optomer SP-172 from Adeka, San-Aid SI-45L, San-Aid SI-60L, San-Aid SI-80L, San-Aid SI-100L, San-Aid SI-110L, San-Aid SI-150L and San-Aid SI-180L from Sanshin Chemical, SarCat CD-1010, SarCat CD-1011 and SarCat CD-1012 from Sartomer, Degacure K185 from Degussa, Rhodorsil Photoinitiator 2074 from Rhodia, CI-2481, CI-2624, CI-2639, CI-2064, CI-2734, CI-2855, CI-2823 and CI-2758 from Nippon Soda, Omnicat 320, Omnicat 430, Omnicat 432, Omnicat 440, Omnicat 445, Omnicat 550, Omnicat 550 BL and Omnicat 650 from IGM Resins, Daicat II from Daicel, UVAC 1591 from Daicel-Cytec, FFC 509 from 3M, BBI-102, BBI-103, BBI-105, BBI-106, BBI-109, BBI-110, BBI-201, BBI-301, BI-105, DPI-105, DPI-106, DPI-109, DPI-201, DTS-102, DTS-103, DTS-105, NDS-103, NDS-105, NDS-155, NDS-159, NDS-165, TPS-102, TPS-103, TPS-105, TPS-106, TPS-109, TPS-1000, MDS-103, MDS-105, MDS-109, MDS-205, MPI-103, MPI-105, MPI-106, MPI-109, DS-100, DS-101, MBZ-101, MBZ-201, MBZ-301, NAI-100, NAI-101, NAI-105, NAI-106, NAI-109, NAI-1002, NAI-1003, NAI-1004, NB-101, NB-201, NDI-101, NDI-105, NDI-106, NDI-109, PAI-01, PAI-101, PAI-106, PAI-1001, PI-105, PI-106, PI-109, PYR-100, SI-101, SI-105, SI-106 and SI-109 from Midori Kagaku, Kayacure PCI-204, Kayacure PCI-205, Kayacure PCI-615, Kayacure PCI-625, Kayarad 220 and Kayarad 620, PCI-061T, PCI-062T, PCI-020T, PCI-022T from Nippon Kayaku, TS-01 and TS-91 from Sanwa Chemical, Deuteron UV 1240 from Deuteron, Tego Photocompound 1465N from Evonik, UV 9380 C-D1 from GE Bayer Silicones, FX 512 from Cytec, Silicolease UV Cata 211 from Bluestar Silicones and Irgacure 250, Irgacure 261, Irgacure 270, Irgacure PAG 103, Irgacure PAG 121, Irgacure PAG 203, Irgacure PAG 290, Irgacure CGI 725, Irgacure CGI 1380, Irgacure CGI 1907 and Irgacure GSID 26-1 from BASF.

The person skilled in the art is aware of further systems that are likewise usable in accordance with the invention. Photoinitiators are used in uncombined form or as a combination of two or more photoinitiators.

Suitable tackifying resins that are optionally present are tackifying resins as known to those skilled in the art, for example from the Satas.

Particularly advantageously, the pressure-sensitive adhesive contains at least one type of a preferably at least partly hydrogenated tackifying resin, advantageously one compatible with the elastomer component or, if a copolymer formed from hard and soft blocks is used, mainly with the soft block (plasticizer resins).

It is advantageous when corresponding tackifying resin has a softening temperature measured by the Ring & Ball method of greater than 25° C. It is additionally advantageous when, in addition, at least one type of tackifying resin having a softening temperature of less than 20° C. is used. It is possible by this means, if required, to finely adjust the adhesive characteristics on the one hand, but also the adaptation characteristics on the bonding substrate on the other hand.

For comparatively nonpolar elastomers, resins used in the pressure-sensitive adhesive may advantageously be partially or fully hydrogenated resins based on rosin and rosin derivatives, hydrogenated polymers of dicyclopentadiene, partially, selectively or fully hydrogenated hydrocarbon resins based on $C_5$, $C_5/C_9$ or $C_9$ monomer streams, polyterpene resins based on α-pinene and/or β-pinene and/or δ-limonene and/or $\Delta^3$-carene, hydrogenated polymers of preferably pure $C_8$ and $C_9$ aromatics. The aforementioned tackifying resins may be used either alone or in a mixture.

It is possible to use resins that are either solid or liquid at room temperature. In order to assure a high ageing and UV stability, preference is given to hydrogenated resins having a hydrogenation level of at least 90%, preferably of at least 95%.

It is possible to add customary additives to the adhesive, such as ageing stabilizers (antiozonants, antioxidants, light stabilizers, etc.).

Further additives which may typically be utilized are:
plasticizing agents, for example plasticizer oils or low molecular weight liquid polymers, for example low molecular weight polybutenes
primary antioxidants, for example sterically hindered phenols
secondary antioxidants, for example phosphites or thioethers
process stabilizers, for example carbon radical scavengers
light stabilizers, for example UV absorbers or sterically hindered amines
processing auxiliaries and
end block reinforcer resins.

The proportion of the reactive resin in the adhesive is from 15% to 80% by weight, especially from 20% to 70% by weight and more preferably from 25% to 65% by weight. In order to achieve good ease of use and an elastic adhesive after curing, a preferred reactive resin content is 15% to 35% by weight, especially 20% to 30% by weight. For more highly crosslinked adhesive bonds, reactive resin contents of 65% to 80% by weight are preferred. Reactive resin contents giving a particularly good balance in relation to elasticity and crosslinking level are from 35% to 65% by weight.

It is additionally possible that the reactive resin content consists of up to 100% of the oligomeric alkoxysiloxane. If the oligomeric alkoxysiloxane makes up 100% of the reactive resin content, no further reactive resin is present in the adhesive. In this case, the preferred proportions of alkoxysiloxane correspond to those mentioned above for the reactive resin. Use of exclusively alkoxysiloxane as reactive resin is especially advantageous when the oligomeric alkoxysiloxane is a comparatively long-chain oligomer, in other words when the average number of repeat $SiR_2$ groups is greater than 5, preferably greater than 10 and especially greater than 20.

In a preferred execution, the reactive resin comprises acrylates, methacrylates and/or epoxy groups, especially aliphatic and very especially preferably cycloaliphatic epoxy groups.

Very particularly suitable adhesives are those in which the reactive resin and oligomeric alkoxysiloxane have the same kind of groups, especially the same functional polymerizable groups. In this case, the reactive resin and alkoxysiloxane can polymerize and crosslink with one another in a particularly good manner. "The same kind of functional polymerizable groups" is understood to mean those that are chemically very similar to one another, for example cyclic ethers having different ring size or acrylates and methacrylates.

In a preferred execution, the adhesive is cured by cationic, thermal or radiation-induced means. It is additionally preferable that the adhesive contains at least one type of photoinitiator for the cationic curing of the crosslinkable component.

Preferably, the at least one elastomer is formed from at least one olefinic monomer and/or from at least one polyurethane. More preferably, the elastomer is at least one vinylaromatic block copolymer.

Siloxanes in the context of the invention are understood to mean compounds having at least two $SiR_2$ groups bonded via an oxygen atom. The term "oligomeric" in the context of the invention means that the number of repeat $SiR_2$ groups is between 2 and 40. The compounds may be catenated or cyclic.

Oligomeric siloxanes are obtainable, for example, from Evonik (Dynasylan 6490, 6498, 6598, 1175), Momentive (Coatosil MP200) or Shin-Etsu (X-41-1053, X-41-1059A, X-41-1056).

The inventive multifunctional oligomeric siloxanes contain at least 2 different functional groups as R radicals and have a polymerization level of ≥2. More preferably, in the context of this invention, one of the functional groups here is polymerizable (meaning that one R radical is, for example, cyclic ether, epoxide, vinyl, acrylate, methacrylate, isocyanate) and another is capable of reaction with water (meaning that the other R radical is, for example, an alkoxy group such as methoxy or ethoxy). It has been found that especially suitable multifunctional oligomeric siloxanes are those which bear a group polymerizable with the reactive resin. In some cases, it is advantageous when the polymerizable group is the same as that in the reactive resin.

Examples of inventive multifunctional oligomeric siloxanes are oligomers of 2-(3,4-epoxycyclohexyl)ethylmethyldimethoxysilane, 2-(3,4-epoxycyclohexyl)ethylmethyldiethoxysilane, gamma-(glycidoxypropyl)trimethoxysilane, gamma-(glycidoxypropyl)triethoxysilane and especially of 2-(3,4-epoxycyclohexyl)ethyltrimethoxysilane and 2-(3,4-epoxycyclohexyl)ethyltriethoxysilane.

More preferably, the inventive adhesive is a pressure-sensitive adhesive. This makes it possible for the ease of use to be particularly good, since the adhesive already sticks to the site to be bonded prior to crosslinking.

Pressure-sensitive adhesives refer to adhesives which, even under relatively gentle contact pressure, allow a lasting bond to the substrate and can be detached again from the substrate essentially without residue after use. Pressure-sensitive adhesives are permanently pressure-sensitive at room temperature, and thus have sufficiently low viscosity and high tackiness to the touch, such that they wet the surface of the particular substrate even at low contact pressure. The bonding capacity of corresponding adhesives is based on their adhesive properties, and the redetachability on their cohesive properties. Useful bases for pressure-sensitive adhesives include various materials.

The present invention additionally relates to an adhesive tape coated on one side or on both sides with the inventive adhesive. This adhesive tape may also be a transfer adhesive tape. An adhesive tape enables particularly simple and precise bonding and is therefore particularly suitable.

Finally, the present invention relates to the use of the inventive adhesive or the inventive adhesive tape as sealing compound, especially for encapsulation of assemblies in organic electronics. As detailed above, it is of eminent importance in organic electronics that the components have to be protected from water (vapour). Because of their very good barrier properties, the inventive adhesives or adhesive tapes are capable of giving corresponding protection. Because of the high transparency and low damage to the electronics to be encapsulated, the inventive adhesive and the inventive adhesive tape, as well as edge encapsulation, are especially also suitable for full-area encapsulation of organic electronics.

The general expression "adhesive tape" encompasses a carrier material provided with a (pressure-sensitive) adhesive on one or both sides. The carrier material includes any flat structures, for example films or film sections elongated in two dimensions, tapes having extended length and limited width, tape sections, die-cut parts (for example in the form of edges or boundaries of an (opto)electronic arrangement), multilayer arrangements and the like. For various applications, it is possible to combine a wide variety of different carriers, for example films, woven fabrics, nonwoven fabrics and papers, with the adhesives. In addition, the term "adhesive tape" also encompasses what are called "transfer adhesive tapes", i.e. an adhesive tape with no carrier. In the case of a transfer adhesive tape, the adhesive is instead applied prior to application between flexible liners provided with a release layer and/or having anti-adhesive properties. For application, it is regularly the case that one liner is first removed, the adhesive is applied and then the second liner is removed. The adhesive can thus be used directly for bonding of two surfaces in (opto)electronic arrangements.

Also possible are adhesive tapes in which there are not two liners but instead a single double-sided separating liner. In that case, the adhesive tape web is covered on its top side by one side of a double-sided separating liner and on its bottom side by the reverse side of the double-sided separating liner, especially of an adjacent winding in a bale or a roll.

The carrier material used for an adhesive tape in the present context preferably comprises polymer films, film composites, or films or film composites provided with organic and/or inorganic layers. Films/film composites of this kind may consist of any standard plastics used for film production, by way of example but without restriction:

polyethylene, polypropylene—especially oriented polypropylene produced by mono- or biaxial stretching (OPP), cyclic olefin copolymers (COC), polyvinyl chloride (PVC), polyesters—especially polyethylene terephthalate (PET) and polyethylene naphthalate (PEN), ethylene-vinyl alcohol (EVOH), polyvinylidene chloride (PVDC), polyvinylidene fluoride (PVDF), polyacrylonitrile (PAN), polycarbonate (PC), polyamide (PA), polyether sulphone (PES) or polyimide (PI).

Polyester films have the advantage of ensuring thermal stability and introducing elevated mechanical stability. Most preferably, therefore, a carrier layer in an inventive liner consists of a polyester film, for example of biaxially stretched polyethylene terephthalate.

In a preferred embodiment, the carrier material also includes a barrier function against one or more specific permeate(s), especially against water vapour and oxygen. Such a barrier function may consist of organic or inorganic materials. Carrier materials having a barrier function are described in detail in EP 2 078 608 A1.

More preferably, the carrier material comprises at least one inorganic barrier layer. Inorganic barrier layers of particularly good suitability are metals deposited under reduced pressure (for example by means of vaporization, CVD, PVD, PECVD) or under atmospheric pressure (for example by means of atmospheric plasma, reactive corona discharge or flame pyrolysis), such as aluminium, silver, gold, nickel, or especially metal compounds such as metal oxides, nitrides or hydronitrides, for example oxides or nitrides of silicon, of boron, of aluminium, of zirconium, of hafnium or of tellurium, or indium tin oxide (ITO). Likewise suitable are layers of the aforementioned variants that have been doped with further elements.

In the case of double-sided (self-)adhesive tapes, the upper and lower layers employed may be inventive compositions of the same or different kind(s) and/or of the same or different layer thickness(es). The carrier on one or both sides may have been pretreated in accordance with the prior art, such that, for example, an improvement in adhesive anchoring is achieved. It is likewise possible for one or both sides to have been provided with a functional layer which can function, for example, as barrier layer. The pressure-sensitive adhesive layers may optionally be covered with release papers or release films. Alternatively, it is also possible for only one adhesive layer to be covered with a double-sided separating liner.

In one variant, in the double-sided (self-)adhesive tape, an inventive adhesive is provided, as is one further adhesive, for example any having particularly good adhesion to a covering substrate or exhibiting particularly good repositionability.

The thickness of the pressure-sensitive adhesive present either in the form of a transfer adhesive tape or coated on a flat structure is preferably between 1 μm and 2000 μm, further preferably between 5 μm and 500 μm and more preferably between about 12 μm and 250 μm.

Layer thicknesses between 50 μm and 150 μm are used when improved adhesion on the substrate and/or a dampening effect is to be achieved.

Layer thicknesses between 1 μm and 50 μm reduce the material input. However, there is a reduction in the adhesion on the substrate.

For double-sided adhesive tapes, it is likewise the case for the adhesive(s) that the thickness of the individual pressure-sensitive adhesive layer(s) is preferably between 1 μm and 2000 μm, further preferably between 5 μm and 500 μm and more preferably between about 12 μm and 250 μm. If a further adhesive is used in addition to one inventive adhesive in double-sided adhesive tapes, it may also be advantageous if the thickness thereof is above 150 μm.

Adhesive tapes coated with adhesives on one or both sides are usually wound at the end of the production process to give a roll in the form of an Archimedean spiral. In order to prevent the adhesives from coming into contact with one another in the case of double-sided adhesive tapes, or in order to prevent the adhesive from sticking to the carrier in the case of single-sided adhesive tapes, the adhesive tapes are covered with a covering material (also referred to as separating material) prior to winding, which is wound up together with the adhesive tape. The person skilled in the art knows such covering materials by the name of liner or release liner. As well as the covering of single- or double-sided adhesive tapes, liners are also used to cover pure adhesives (transfer adhesive tape) and adhesive tape sections (for example labels).

Also disclosed herein is a method for protecting an organic electronic arrangement disposed on a substrate, wherein a cover is applied to the electronic arrangement in such a way that the electronic arrangement is at least partly covered by the cover, wherein the cover is additionally bonded over at least part of the area on the substrate and/or on the electronic arrangement, wherein the bonding is brought about by means of at least one layer of an adhesive. The adhesive layer especially takes the form of a layer of an adhesive tape.

The method of the invention can advantageously be conducted in such a way that the (pressure-sensitive) adhesive layer, optionally as a constituent of a double-sided adhesive tape comprising further layers, is applied first, and in a subsequent step the cover is applied to the substrate and/or the electronic arrangement. In a further advantageous procedure, the (pressure-sensitive) adhesive layer, optionally as a constituent of a double-sided adhesive tape comprising further layers, and the cover are applied together to the substrate and/or the electronic arrangement.

In the method of the invention, the transfer adhesive tape can thus first be bonded to the substrate or the electronic arrangement or first to the cover. However, it is preferable first to bond the transfer adhesive tape to the cover, since it is thus possible to pre-fabricate one component of the electronic functional unit independently of the electronic arrangement and to attach it by lamination as a whole.

Advantageously, the method of the invention can be conducted in such a way that the cover and/or the (pressure-sensitive) adhesive layer, especially as a transfer adhesive tape, fully cover the electronic arrangement, since the light-scattering action then affects the entire area of the arrangement.

The full-area lamination of the transfer adhesive tape over the electronic arrangement additionally rules out any effect of harmful permeates possibly enclosed in the gas space of a merely edge-encapsulated arrangement, since there is no gas space.

The method of the invention is preferably conducted in such a way that a region of the substrate around the electronic arrangement is also wholly or partly covered by the cover, in which case the adhesive tape for bonding may cover the full area of the electronic arrangement and preferably likewise covers a region of the substrate around the electronic arrangement, preferably the same region as the cover—or may be applied over part of the area, for instance in the form of a frame around the electronic arrangement—preferably in the region which is also covered by the cover—and optionally additionally in an edge region on the electronic arrangement.

The invention further provides an (opto)electronic arrangement comprising at least one (opto)electronic structure and a layer of an inventive adhesive, wherein the adhesive layer fully covers the (opto)electronic structure.

Further details, features and advantages of the present invention are elucidated in detail hereinafter by preferred working examples. The drawings show:

FIG. 7 an (opto)electronic arrangement according to the prior art in schematic view, FIG. 8 a first inventive (opto)electronic arrangement in schematic view, FIG. 9 a second inventive (opto)electronic arrangement in schematic view.

FIG. 7 shows a first configuration of an organic electronic arrangement 1 according to the prior art. This arrangement 1 has a substrate 2 with an electronic structure 3 disposed thereon. The substrate 2 itself takes the form of a barrier for permeates and hence forms part of the encapsulation of the electronic structure 3. Above the electronic structure 3, in the present case also spaced apart therefrom, is disposed a further cover 4 that takes the form of a barrier.

In order to encapsulate the electronic structure 3 at the side as well and simultaneously to bond the cover 4 to the electronic arrangement 1 in addition, an adhesive 5 is provided around the periphery alongside the electronic structure 3 on the substrate 2. It is unimportant here whether the adhesive has been bonded first to the substrate 2 or first to the cover 4. The adhesive 5 bonds the cover 4 to the substrate 2. By means of an appropriately thick configuration, the adhesive 5 additionally enables the cover 4 to be spaced apart from the electronic structure 3.

The adhesive 5 is one according to the prior art, i.e. an adhesive having a high permeation barrier, which may additionally be filled with getter material to a high degree. The transparency of the adhesive is irrelevant in this assembly.

In the present case, a transfer adhesive tape would be provided in the form of a die-cut part which, because of its delicate geometry, is more difficult to handle than a transfer adhesive tape applied essentially over the full area.

FIG. 8 shows an inventive configuration of an (opto)electronic arrangement 1. What is shown is again an electronic structure 3 disposed on a substrate 2 and encapsulated by the substrate 2 from beneath. Above and to the side of the electronic structure, the inventive adhesive, for example in the form of a transfer adhesive tape 6, is now disposed over the full area. The electronic structure 3 is thus encapsulated fully by the transfer adhesive tape 6 from above. A cover 4 has then been applied to the transfer adhesive tape 6. The transfer adhesive tape 6 is one based on the inventive transfer adhesive tape as described above in general form and detailed hereinafter in working examples. The transfer adhesive tape, in the version shown, consists only of one layer of an inventive adhesive.

In contrast to the above configuration, the cover 4 need not necessarily satisfy the high barrier demands, since the barrier is already provided by the adhesive when the electronic arrangement is fully covered by the transfer adhesive tape. The cover 4 may, for example, merely assume a mechanical protective function, but it may also additionally be provided as a permeation barrier.

FIG. 9 shows an alternative configuration of an (opto) electronic arrangement 1. In contrast to the above configurations, two transfer adhesive tapes 6a, b are now provided, which are identical in the present case, but may also be different. The first transfer adhesive tape 6a is disposed over the full area of the substrate 2. The electronic structure 3 is provided upon and is fixed by the transfer adhesive tape 6a. The composite composed of the transfer adhesive tape 6a and electronic structure 3 is then fully covered by the further transfer adhesive tape 6b, such that the electronic structure 3 is encapsulated from all sides by the transfer adhesive tapes 6a, b. The cover 4 is in turn provided above the transfer adhesive tape 6b.

In this configuration, therefore, neither the substrate 2 nor the cover 4 need necessarily have barrier properties. They may nevertheless be provided, in order to further restrict the permeation of permeates to the electronic structure 3.

Especially with regard to FIGS. 8 and 9, it is pointed out that these are schematic diagrams. More particularly, it is not clear from the diagrams that the transfer adhesive tape here, and preferably in each case, has a homogeneous layer thickness. There is therefore no sharp edge formed at the transition to the electronic structure, as appears to be the case in the diagram; instead, the transition is fluid and it is in fact possible for small unfilled or gas-filled regions to remain. If necessary, however, matching to the substrate may also be effected, especially when the application is conducted under reduced pressure. Moreover, the adhesive is subject to different degrees of local compression, and so flow processes can result in a certain degree of compensation for the height differential at the edge structures. The dimensions shown are not to scale either, but instead serve merely for better illustration. Especially the electronic structure itself is generally relatively flat (often less than 1 μm thick).

Direct contact of the adhesive with the electronic assembly is not obligatory either. It is also possible for further layers to be disposed in between, for example a thin-layer encapsulation of the electronic assembly or barrier films.

The thickness of the transfer adhesive tape may include all customary thicknesses, for instance from 1 μm up to 3000 μm. Preference is given to a thickness between 25 and 100 μm, since bonding force and handling properties are particularly positive in this range. A further preferred range is a thickness of 3 to 25 μm, since the amount of substances permeating through the bondline within this range can be kept to a low level merely by virtue of the small cross-sectional area of the bondline in an encapsulation application.

For production of a transfer adhesive tape of the invention, the carrier of the adhesive tape or the liner is coated or printed on one side with the inventive adhesive from solution or dispersion or in neat form (for example a melt), or the adhesive tape is produced by (co)extrusion. Alternatively, production is possible by transfer of an inventive adhesive layer by lamination to a carrier material or a liner. The adhesive layer can be crosslinked by means of heat or high-energy beams.

Preferably, this production process takes place in an environment in which the specific permeate is present only in a low concentration or is virtually not present at all. One example is a relatively air humidity of less than 30%, preferably of less than 15%.

EXAMPLES

Test Methods

Determination of Breakthrough Time (Lifetime Test)

Figure 1:
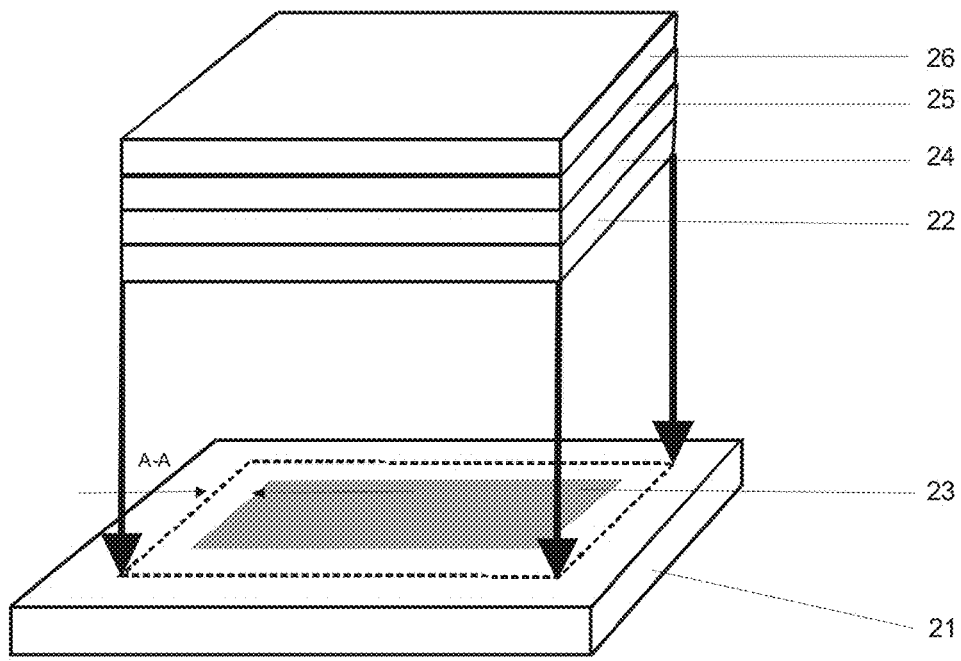
FIG. 1 shows calcium test in the example disclosed hereinbelow.

A measure that was employed for the determination of the lifetime of an electronic assembly was a calcium test. This is shown in FIG. 1. For this purpose, a thin calcium layer 23 of 10×10 mm² in size is deposited onto a glass slide 21 under reduced pressure and then stored under a nitrogen atmosphere. The thickness of the calcium layer 23 is about 100 nm. For the encapsulation of the calcium layer 23, an adhesive tape (23×23 mm²) having the adhesive 22 to be tested and a thin glass slide 24 (35 μm, from Schott) as carrier material are used. For stabilization, the thin glass slide was laminated with a 100 μm-thick PET film 26 by means of a 50 μm-thick transfer adhesive tape 25 to give an acrylate pressure-sensitive adhesive of visually high transparency. The adhesive 22 is applied to the glass slide 21 in such a way that the adhesive 22 covers the calcium mirror 23 with an excess margin of 6.5 mm on all sides (A-A).

Because of the impervious glass carrier 24, only the permeation through the pressure-sensitive adhesive or along the interfaces is determined.

The test is based on the reaction of calcium with water vapour and oxygen, as described, for example, by A. G. Erlat et. al. in "47th Annual Technical Conference Proceedings-Society of Vacuum Coaters", 2004, pages 654 to 659, and by M. E. Gross et al. in "46th Annual Technical Conference Proceedings-Society of Vacuum Coaters", 2003, pages 89 to 92. This involves monitoring the light transmission of the calcium layer, which increases as a result of the conversion to calcium hydroxide and calcium oxide. In the test setup described, this is done from the edge, such that the visible area of the calcium mirror decreases. The time until the light absorption of the calcium mirror has halved is referred to as the lifetime. The method covers both the decrease in the area of the calcium mirror from the edge and via point degradation in the area and the homogeneous reduction in the layer thickness of the calcium mirror resulting from full-area degradation.

The measurement conditions chosen were 60° C. and 90% relative air humidity. The specimens were bonded with a layer thickness of the pressure-sensitive adhesive of 50 µm over the full area and with no bubbles. The degradation of the calcium mirror is monitored via transmission measurements. The breakthrough time is defined as that time that the moisture takes to cover the distance to the calcium. Before attainment of this time at 60° C./90% r.h., there is only a marginal change in the transmission of the calcium mirror.

MMAP and DACP

MMAP is the mixed methylcyclohexane/aniline cloud point which is determined using a modified ASTM C 611 method. Methylcyclohexane is used in place of the heptane used in the standard test method. The method uses resin/aniline/methylcyclohexane in a ratio of 1/2/1 (5 g/10 ml/5 ml), and the cloud point is determined by cooling a heated clear mixture of the three components until complete cloudiness has just set in.

The DACP is the diacetone cloud point and is determined by cooling a heated solution of 5 g of resin, 5 g of xylene and 5 g of diacetone alcohol to the point at which the solution turns cloudy.

Water Vapour Permeation Rate

The WVTR is determined at 38° C. and 90% relative air humidity to ASTM F-1249, and the OTR at 23° C. and 50% relative air humidity to DIN 53380 Part 3. A double determination is conducted in each case and the average is formed. The reported value is normalized to a thickness of 50 µm or is based on the respective thickness of the specimen analysed.

For the measurements, the transfer adhesive tapes were bonded to a highly permeable polysulphone membrane (available from Sartorius) which did not make any contribution to the permeation barrier itself. The measurements were made on crosslinked adhesive tapes.

Molecular Weight

The molecular weight determinations of the number-average molecular weights $M_n$ and the weight-average molecular weights $M_w$ were made by means of gel permeation chromatography (GPC). The eluent used was THF (tetrahydrofuran) with 0.1% by volume of trifluoroacetic acid. The measurement was made at 25° C. The precolumn used was PSS-SDV, 5µ, $10^3$ Å, ID 8.0 mm×50 mm. For separation, the columns used were PSS-SDV, 5µ, $10^3$ and $10^5$ and $10^6$ each with ID 8.0 mm×300 mm. The sample concentration was 4 g/l; the flow rate was 1.0 ml per minute. Measurement was effected against polystyrene standards.

Softening Temperature

The reactive resin or tackifying resin softening temperature is determined by the standard methodology, which is known as the Ring and Ball method and is standardized in ASTM E28.

The tackifying resin softening temperature of the resins is determined using a Herzog HRB 754 Ring and Ball tester. Resin specimens are first crushed finely with a mortar and pestle. The resulting powder is introduced into a brass cylinder open at the base (internal diameter in the upper part of the cylinder 20 mm, diameter of the base opening of the cylinder 16 mm, height of the cylinder 6 mm) and melted on a hot stage. The filling volume is chosen such that the resin after melting fills the cylinder fully without excess.

The resulting specimen together with the cylinder is placed into the sample holder of the HRB 754. The equilibration bath is filled with glycerol if the tackifying resin softening temperature is between 50° C. and 150° C. At lower tackifying resin softening temperatures, it is also possible to work with a water bath. The test balls have a diameter of 9.5 mm and weigh 3.5 g. In accordance with the HRB 754 procedure, the ball is arranged above the test specimen in the equilibration bath and placed onto the test specimen. 25 mm beneath the base of the cylinder is a collector plate, and 2 mm above the latter is a light barrier. During the measurement process, the temperature is increased at 5° C./min. In the temperature range of the tackifying resin softening temperature, the ball begins to move through the base opening of the cylinder until it finally comes to rest on the collector plate. In this position, it is detected by the light barrier and the temperature of the equilibration bath at this time is registered. A double determination takes place. The tackifying resin softening temperature is the average from the two individual determinations.

Gel Content

The gel content was determined by gravimetric means. For this purpose, curing of the adhesive is induced by radiation. The cured adhesive is weighed ($M_0$) and then extracted with toluene in a Soxhlet extractor for 24 h. The dry residue is weighed again ($M_1$). The gel content is reported in percent and is calculated from $GC=(M_1/M_0)*100$.

Adhesive Layers

For production of adhesive layers, various adhesives were applied from a solution to a conventional liner (siliconized polyester film) by means of a laboratory spreading instrument and dried. The adhesive layer thickness after drying was 50±5 µm. Drying was effected in each case first at RT for 10 minutes and at 120° C. in a laboratory drying cabinet for 10 minutes. The dried adhesive layers were each laminated on the open side immediately after drying with a second liner (siliconized polyester film with lower release force).

Raw Materials Used:

| | |
|---|---|
| Sibstar 62M | SiBS (polystyrene-block-polyisobutylene block copolymer) from Kaneka with block polystyrene content 20% by weight. Also contains some diblock copolymer. |
| Uvacure 1500 | cycloaliphatic diepoxide from Cytec ((3,4-epoxycyclohexane) methyl 3,4-epoxycyclohexylcarboxylate) |
| Escorez 5300 | a fully hydrogenated hydrocarbon resin from Exxon (Ring and Ball 105° C., DACP = 71, MMAP = 72) |
| Polyacrylate | acrylate copolymer formed from 2-hydroxyethyl acrylate, 2-ethylhexyl acrylate and C-17 acrylate, $M_n$ = 884 000 g/mol |
| Dynasylan 9896 | oligomeric propyltrimethoxysiloxane |
| Vinyltrimethoxysilane | |
| 2-(3,4-epoxycyclohexyl) ethyltrimethoxysilane | trimethoxysilane with cycloaliphatic epoxy group |
| Dynasylan 6490 | oligomeric vinyltrimethoxysiloxane |
| triarylsulphonium hexafluoroantimonate | cationic photoinitiator from Sigma-Aldrich The photoinitiator has an absorption maximum in the range of 320 nm to 360 nm and was in the form of a 50% by weight solution in propylene carbonate. |

The polyacrylate (acrylate copolymer formed from 2-hydroxyethyl acrylate, 2-ethylhexyl acrylate and C-17 acrylate, $M_n$=884 000 g/mol) was prepared by the following method: A 2 l glass reactor of a conventional type for free-radical polymerizations was charged with 40 g of 2-hydroxyethyl acrylate, 240 g of 2-ethylhexyl acrylate, 120 g of C17 acrylate (three branched side chains with C3-C4 chain segments, BASF SE), 133 g of 69/95 special boiling point spirit and 133 g of acetone. After nitrogen gas had been passed through the reaction solution while stirring for 45 minutes, the reactor was heated to 58° C. and 0.2 g of Vazo 67 (from DuPont) was added. Subsequently, the external heating bath was heated to 75° C. and the reaction was conducted constantly at this external temperature. After 1 h of reaction time, 50 g of toluene were added. After 2.5 h, dilution was effected with 100 g of acetone. After 4 h of reaction time, another 0.2 g of Vazo 67 was added. After 7 h of polymerization time, dilution was effected with 100 g of 60/95 special boiling point spirit, and after 22 h with 100 g of acetone. After 24 h of reaction time, the polymerization was stopped and the reaction vessel was cooled to room temperature. The molecular weight $M_n$ was 884 000 g/mol.

The copolymer selected was a polystyrene-block-polyisobutylene block copolymer from Kaneka. The proportion of styrene in the overall polymer is 20% by weight. Sibstar 62M was used. The molar mass $M_w$ is 60 000 g/mol. The glass transition temperature of the polystyrene blocks was 100° C. and that of the polyisobutylene blocks −60° C. The tackifying resin used was Escorez 5300 (Ring and Ball 105° C., DACP=71, MMAP=72) from Exxon, a fully hydrogenated hydrocarbon resin. The reactive resin selected was Uvacure 1500 from Dow, a cycloaliphatic diepoxide. These raw materials and optionally the siloxane were dissolved in a mixture of toluene (300 g), acetone (150 g) and 60/95 special boiling point spirit (550 g), so as to give a 50% by weight solution.

Subsequently, a photoinitiator was added to the solution. The photoinitiator took the form of a 50% by weight solution in propylene carbonate. The photoinitiator has an absorption maximum in the range of 320 nm to 360 nm.

The exact composition of the individual examples V1 to V4 and V5 and of K1 can be found in Table 1.

TABLE 1

| | Example: | | | | | |
|---|---|---|---|---|---|---|
| | K1 pts. by wt. | V1 pts. by wt. | V2 pts. by wt. | V3 pts. by wt. | V4 pts. by wt. | V5 pts. by wt. |
| SiBStar 62M | 35.5 | 37.5 | 35.5 | 35.5 | 35.5 | |
| Uvacure 1500 | 24 | 25 | 24 | 24 | 24 | 20 |
| Polyacrylate | 0 | 0 | 0 | 0 | 0 | 75 |
| Vinyltrimethoxysilane | 0 | 0 | 5 | 0 | 0 | 0 |
| Dynasylan 9896 (oligomeric material formed from propyltrimethoxysilane) | 0 | 0 | 0 | 5 | 0 | 5 |
| 2-(3,4-Epoxycyclohexyl)ethyl trimethoxysilane (TME) | 0 | 0 | 0 | 0 | 5 | 0 |
| Dynasylan 6490 (oligomeric material formed from vinyltrimethoxysilane) | 5 | 0 | 0 | 0 | 0 | 0 |
| Escorez 5300 | 35.5 | 37.5 | 35.5 | 35.5 | 35.5 | |
| Triarylsulphonium hexafluoroantimonate | 0.1 | 0.1 | 0.1 | 0.1 | 0.1 | 0.1 |

By means of a coating bar method, the formulation was coated from solution onto a siliconized PET liner and dried at 120° C. for 15 min. The dry coatweight was 50 g/m². The specimen was covered with a further ply of a siliconized but more easily separable PET liner.

The specimens were introduced into a glovebox. Some of the specimens were laminated without bubbles with a rubber roller onto a glass substrate which had been subjected to calcium vapour deposition. This was covered with the second PET liner and a ply of a thin glass was laminated on. Subsequently, curing was effected through the cover glass by means of UV light (dose: 80 mJ/cm²; lamp type: undoped mercury source). This specimen was used for the lifetime test.

The graphs for the course of the lifetime test are reproduced in FIGS. 2 to 6.

Figure 2:
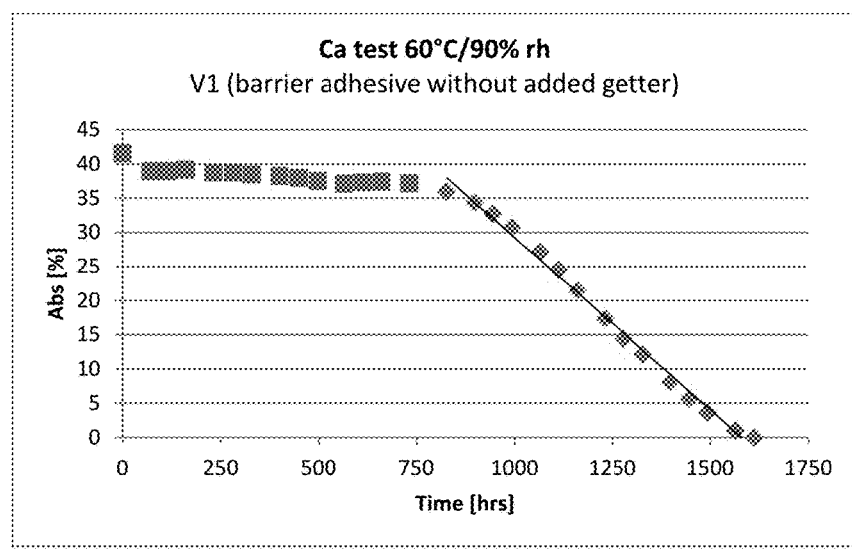
FIG. 2 shows the adhesive according to Example V1, i.e. the adhesive without added getter.

FIG. 2 shows the adhesive according to Example V1, i.e. the adhesive without added getter.

Figure 3:
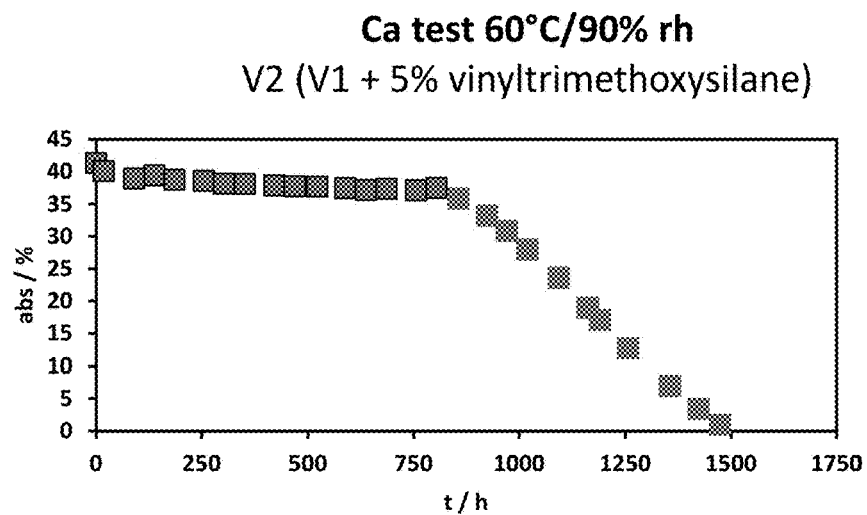
FIG. 3 shows the adhesive according to Example V2, i.e. an adhesive with a multifunctional getter, but in monomeric and not oligomeric form.

FIG. 3 shows the adhesive according to Example V2, i.e. an adhesive with a multifunctional getter, but in monomeric and not oligomeric form.

Figure 4:
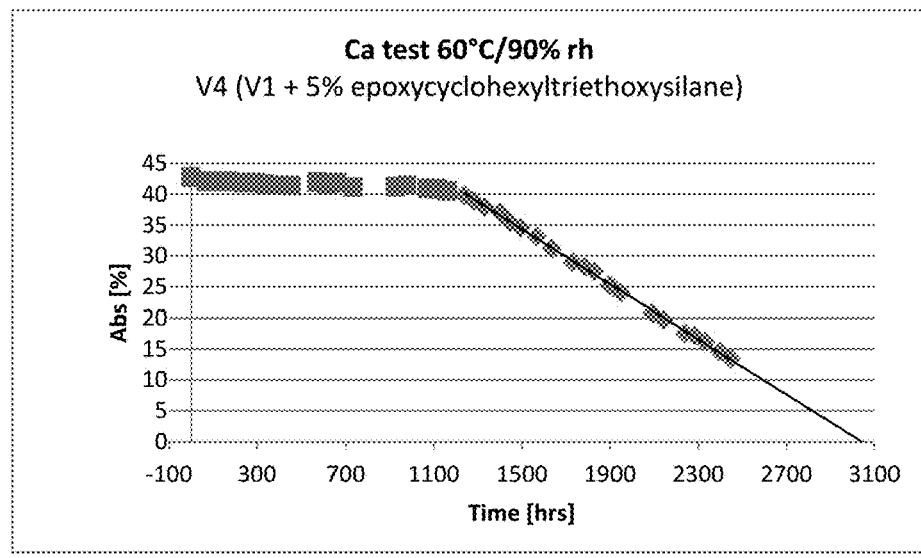
FIG. 4 shows the adhesive according to Example V4, i.e. likewise an adhesive with a multifunctional getter, but in monomeric and not oligomeric form.

FIG. 4 shows the adhesive according to Example V4, i.e. likewise an adhesive with a multifunctional getter, but in monomeric and not oligomeric form.

Figure 5:
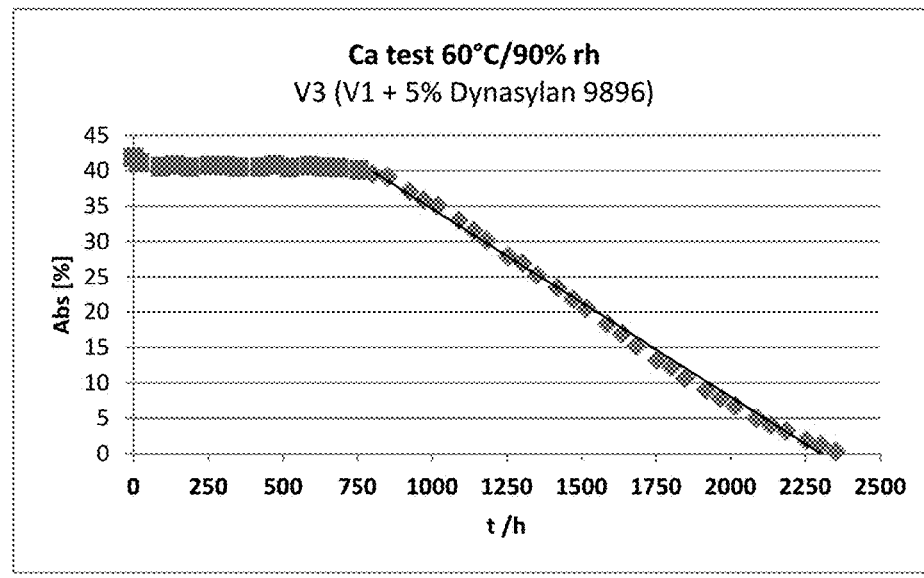
FIG. 5 shows the adhesive according to Example V3, i.e. an adhesive with an oligomeric getter, but not in multifunctional form, meaning that it does not enable crosslinking.

FIG. 5 shows the adhesive according to Example V3, i.e. an adhesive with an oligomeric getter, but not in multifunctional form, meaning that it does not enable crosslinking.

Figure 6:
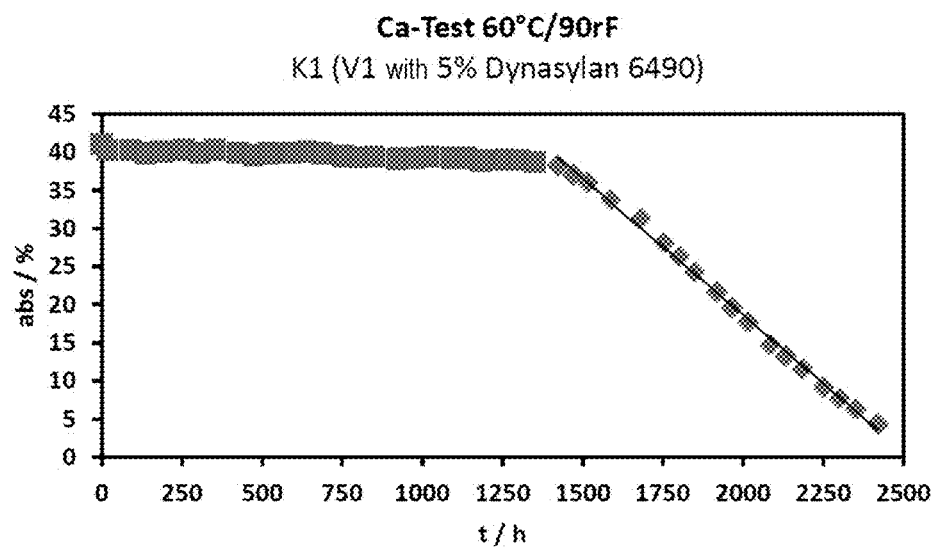
FIG. 6 shows the inventive adhesive according to Example K1, which is multifunctional and in oligomeric form.
Figure 7:
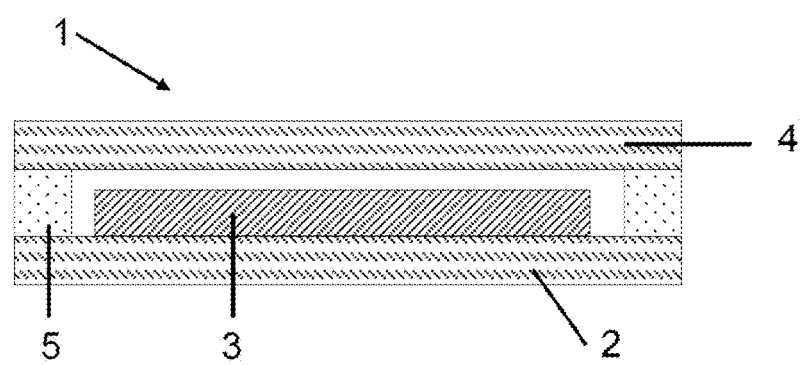
FIG. 7 shows an (opto)electronic arrangement according to the prior art in schematic view.
Figure 8:
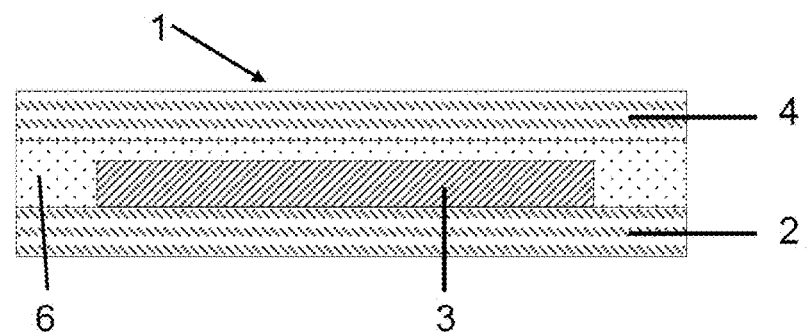
FIG. 8 shows a first inventive (opto)electronic arrangement in schematic view.
Figure 9:
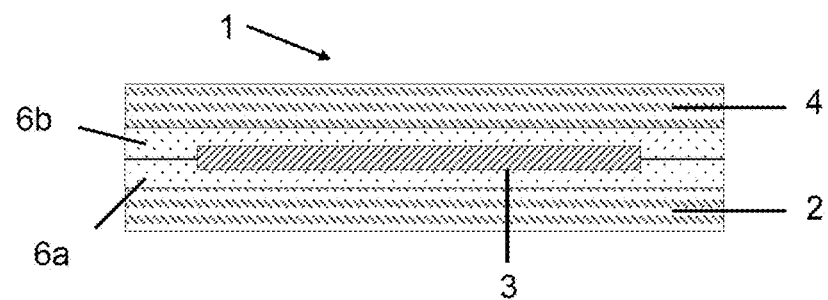
FIG. 9 shows a second inventive (opto)electronic arrangement in schematic view.

Finally, FIG. 6 shows the inventive adhesive according to Example K1, which is multifunctional and in oligomeric form.

The results of the moisture permeation measurement of the base adhesive (V1) and an acrylate adhesive (V5) without addition of a water scavenger are shown in Table 2.

TABLE 2

|  | V1 | V5 |
|---|---|---|
| WVTR/g $m^{-2}d^{-1}$ | 7 | 712 |

This shows that the base adhesive described here, unlike V5, has a very low WVTR value (less than 100 g/m²d, preferably less than 50 g/m²d, especially less than 15 g/m²d). If these results are compared with the barrier properties achieved, it is found that only the inventive adhesives have a breakthrough time (lag time) with less than 100 g/m²d (see Table 3).

The breakthrough times determined for water in the calcium test are listed in Table 3 below:

TABLE 3

| Designation | Breakthrough time/h | Gel content/% |
|---|---|---|
| V1 (no additional getter) | 750 | 26 |
| V2 (5% vinyltrimethoxysilane) | 800 | 29 |
| V3 (5% Dynasylan 9896) | 780 | 23 |
| V4 (5% TME) | 1150 | 30 |
| V5 (5% Dynasylan 9896) | 0 | 24 |
| K1 (5% Dynasylan 6490) | 1400 | 31 |

It can be inferred from the table that the breakthrough time of water molecules is distinctly improved by a pressure-sensitive adhesive containing a multifunctional alkoxysiloane having polymerizable and water-binding groups. In principle, it is possible to increase the breakthrough time of barrier adhesives with alkoxysilane compounds (V4) compared to barrier adhesives lacking any such added molecules (V1). However, the performance of the multifunctional siloxane getter is even higher, even though the relative amount of water-scavenging groups is lower (K1). The relative amount of water-scavenging groups is lower since there is statistically only one alkoxysilane group present per repeat unit. In contrast, vinyltrimethoxysilane and TME each contain 3 alkoxysilane groups.

The polymerizable vinyl groups are incorporated as well into the epoxy network in the curing step, and so there is no lowering of the point network density compared to V1. Adhesives comprising the monomeric vinyltrimethoxysilane analogue (V2) do not have any significant improvement in the breakthrough time of water compared to adhesives lacking added getters. Here too, as is the case for V4, there is a reduction in the network density compared to V1. The effect of this is that diffusion is facilitated because of the less tight network and hence, in spite of the getter function, there is not such a distinct rise in performance as with the multifunctional oligomeric siloxane that additionally functions as crosslinker in K1. V3 likewise contains an oligomeric siloxane (oligomeric material formed from propyltrimethoxysilane), but one which is not multifunctional and accordingly does not cure in the curing step. Thus, it acts as a kind of plasticizer and also enables easier permeation of water molecules, and so the performance of the barrier adhesive is comparable to the adhesive without getter additization in spite of the alkoxysilane groups.

This clearly shows the advantage of the inventive adhesive, since only when the getter has more than one polymerizable group and more than one water-scavenging group does it function as water scavenger and crosslinker. The addition of the getter thus does not increase the permeability of the adhesive.

The invention claimed is:

1. An adhesive having water vapour barrier properties, comprising
    an adhesive base comprising
        (i) at least one reactive resin
        (ii) at least one polymer
        (iii) optionally at least one tackifying resin,
        (iv) optionally a solvent,
    wherein the adhesive comprises
    at least one multifunctional oligomeric alkoxysiloxane, said oligomeric alkoxysiloxane comprising more than one polymerizable group and more than one alkoxy group.

2. The adhesive according to claim 1, wherein the adhesive base has a water vapour permeation rate after activation of the reactive resin component of less than 100 g/m²d.

3. The adhesive according to claim 1, wherein the at least one alkoxysiloxane is a compound of the general formula

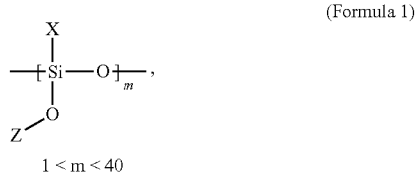

(Formula 1)

$1 < m < 40$ wherein X is a radical having a polymerizable group selected from the group consisting of cyclic ether, vinyl, acrylate, methacrylate, hydroxyl, amino and isocyanate;
Z is an alkyl or aryl group,
wherein the X radicals of different repeat units may be the same or different,
wherein the Z radicals of different repeat units may be the same or different.

4. The adhesive according to claim 1, wherein the amount of reactive resin is 15% to 80% by weight.

5. The adhesive according to claim 1, wherein the reactive resin comprises, as polymerizable group, at least one group selected from the group consisting of acrylates, methacrylates, and cyclic ethers.

6. The adhesive according to claim 1, wherein the adhesive is a pressure-sensitive adhesive.

7. The adhesive according to claim 1, wherein the adhesive is cured by cationic means.

8. The adhesive according to claim 1, wherein the adhesive comprises a photoinitiator.

9. The adhesive according to claim 1, wherein the polymerizable group of the multifunctional alkoxysiloxane is at least one group selected from the group consisting of cyclic ether, acrylate, methacrylate and vinyl.

10. The adhesive according to claim 1, wherein the at least one elastomer is at least one vinylaromatic block copolymer.

11. An adhesive tape comprising an adhesive according to claim 1.

12. A method of encapsulating an assembly of organic electronics comprising a step of applying the adhesive according to claim 1.

13. A method for protecting an organic electronic arrangement disposed on a substrate, comprising a step of applying a cover to the electronic arrangement in such a way that the electronic arrangement is at least partly covered by the cover, wherein the cover is additionally bonded, by means of at least one layer of an adhesive according claim 1, over at least part of an area on the substrate and/or on the electronic arrangement.

14. The method according to claim 13, wherein the adhesive is in the form of a layer of an adhesive tape.

15. The method according to claim 13, wherein the adhesive layer, optionally as a constituent of a double-sided adhesive tape comprising further layers, is applied first, and in a subsequent step the cover is applied to the substrate and/or the electronic arrangement.

16. The method according to claim 13, wherein the adhesive layer and the cover are applied together to the substrate and/or the electronic arrangement.

17. The method according to claim 13, wherein the cover fully covers the electronic arrangement.

18. The method according to claim 13, wherein a region of the substrate around the electronic arrangement is also wholly or partly covered by the cover.

* * * * *